(12) United States Patent
Nishimura

(10) Patent No.: US 10,593,787 B2
(45) Date of Patent: Mar. 17, 2020

(54) SEMICONDUCTOR DEVICE AND METHOD OF MANUFACTURING SEMICONDUCTOR DEVICE

(71) Applicant: FUJI ELECTRIC CO., LTD., Kanagawa (JP)

(72) Inventor: Takeyoshi Nishimura, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 94 days.

(21) Appl. No.: 15/088,132

(22) Filed: Apr. 1, 2016

(65) Prior Publication Data

US 2016/0336434 A1 Nov. 17, 2016

(30) Foreign Application Priority Data

May 14, 2015 (JP) ................... 2015-098744

(51) Int. Cl.
*H01L 21/02* (2006.01)
*H01L 29/78* (2006.01)
(Continued)

(52) U.S. Cl.
CPC ...... *H01L 29/7397* (2013.01); *H01L 29/0878* (2013.01); *H01L 29/402* (2013.01);
(Continued)

(58) Field of Classification Search
CPC ............... H01L 29/7397; H01L 29/402; H01L 29/66348; H01L 29/66734; H01L 29/7811;
(Continued)

(56) References Cited

U.S. PATENT DOCUMENTS 5,323,040 A * 6/1994 Baliga ................. H01L 29/1608
257/331
5,559,045 A 9/1996 Yamamoto
(Continued)

FOREIGN PATENT DOCUMENTS

JP S5658267 A 5/1981
JP S59-69943 A 4/1984
(Continued)

OTHER PUBLICATIONS

Office Action issued for counterpart Japanese Application No. 2015-098744, drafted by the Japan Patent Office dated Dec. 28, 2018.
(Continued)

*Primary Examiner* — Mary A Wilczewski
*Assistant Examiner* — Tsz K Chiu

(57) ABSTRACT

A semiconductor layer may be subjected to etching to form a trench therein. An epitaxial layer may be further formed in the trench. Here, the impurity concentration of the epitaxial layer is controlled to be lower than that of the semiconductor layer. In this manner, concentration of electrical fields in the trench is reduced. A first innovations herein provides a semiconductor device including a first semiconductor layer containing impurities of a first conductivity type, a trench provided in the first semiconductor layer on a front surface side thereof, and a second semiconductor layer provided on an inner wall of the trench, where the second semiconductor layer contains impurities of the first conductivity type at a lower concentration than the first semiconductor layer.

11 Claims, 14 Drawing Sheets

(51) Int. Cl.
   *H01L 21/336*   (2006.01)
   *H01L 29/66*   (2006.01)
   *H01L 29/40*   (2006.01)
   *H01L 29/417*   (2006.01)
   *H01L 27/105*   (2006.01)
   *H01L 29/423*   (2006.01)
   *H01L 29/739*   (2006.01)
   *H01L 29/08*   (2006.01)
   *H01L 29/16*   (2006.01)

(52) U.S. Cl.
   CPC .. *H01L 29/66348* (2013.01); *H01L 29/66734* (2013.01); *H01L 29/7811* (2013.01); *H01L 29/7813* (2013.01); *H01L 29/1608* (2013.01)

(58) Field of Classification Search
   CPC ............. H01L 29/7813; H01L 29/0878; H01L 29/1608; H01L 29/66068; H01L 29/7828; H01L 29/4236; H01L 29/0847
   See application file for complete search history.

(56)   References Cited

U.S. PATENT DOCUMENTS

| | | | | |
|---|---|---|---|---|
| 5,576,567 A * | 11/1996 | Mori | ..................... | H01L 27/115 257/316 |
| 5,733,810 A | 3/1998 | Baba | | |
| 5,744,826 A * | 4/1998 | Takeuchi | ............ | H01L 29/7813 257/77 |
| 5,976,936 A * | 11/1999 | Miyajima | ........... | H01L 29/7828 438/268 |
| 6,570,185 B1 * | 5/2003 | Tan | ..................... | H01L 29/0619 257/77 |
| 6,657,255 B2 * | 12/2003 | Hshieh | ................ | H01L 29/0653 257/329 |
| 7,170,109 B2 * | 1/2007 | Sugihara | ........... | H01L 21/76224 257/192 |
| 7,241,694 B2 * | 7/2007 | Takeuchi | .............. | H01L 29/045 257/E21.066 |
| 7,541,300 B2 * | 6/2009 | Kumar | ............. | H01L 29/66666 257/E21.054 |
| 7,625,793 B2 * | 12/2009 | Calafut | ............... | H01L 29/0878 438/212 |
| 7,825,449 B2 * | 11/2010 | Suzuki | ................ | H01L 29/0619 257/301 |
| 7,834,407 B2 * | 11/2010 | Nakazawa | .......... | H01L 27/0255 257/401 |
| 7,994,513 B2 * | 8/2011 | Yamamoto | .......... | H01L 29/0623 257/77 |
| 8,247,866 B2 * | 8/2012 | Izumi | .................. | H01L 29/0619 257/330 |
| 8,772,868 B2 * | 7/2014 | Yedinak | ............... | H01L 29/402 257/341 |
| 9,142,668 B2 * | 9/2015 | Cheng | ................. | H01L 29/7827 |
| 10,236,339 B2 * | 3/2019 | Kyogoku | ............... | H01L 21/22 |
| 2005/0189585 A1 * | 9/2005 | Jones | .................. | H01L 29/0886 257/330 |
| 2006/0157779 A1 * | 7/2006 | Kachi | ............... | H01L 29/66727 257/330 |
| 2007/0278565 A1 * | 12/2007 | Tu | ....................... | H01L 29/0634 257/330 |
| 2008/0035987 A1 * | 2/2008 | Hebert | ............. | H01L 21/26586 257/330 |
| 2008/0230787 A1 | 9/2008 | Suzuki | | |
| 2009/0200559 A1 * | 8/2009 | Suzuki | .................. | H01L 29/086 257/77 |
| 2009/0286372 A1 * | 11/2009 | de Fresart | .......... | H01L 29/0634 438/270 |
| 2009/0311839 A1 * | 12/2009 | Miyahara | .......... | H01L 21/26513 438/270 |
| 2010/0102383 A1 | 4/2010 | Izumi | | |
| 2011/0272759 A1 * | 11/2011 | Bol | ..................... | H01L 29/0634 257/330 |
| 2014/0145212 A1 * | 5/2014 | Takeuchi | ........... | H01L 29/66068 257/77 |
| 2015/0035051 A1 * | 2/2015 | Hebert | ................ | H01L 29/7813 257/334 |

FOREIGN PATENT DOCUMENTS

| | | |
|---|---|---|
| JP | H1-246844 A | 10/1989 |
| JP | H09260653 A | 10/1997 |
| JP | 2000-58823 A | 2/2000 |
| JP | 2005-32792 A | 2/2005 |
| JP | 2007087985 A | 4/2007 |
| JP | 2007-329385 A | 12/2007 |
| JP | 2008235546 A | 10/2008 |
| JP | 2010103314 A | 5/2010 |

OTHER PUBLICATIONS

Office Action issued for counterpart Japanese Application No. 2015-098744, issued by the Japan Patent Office dated May 28, 2019(drafted on May 23, 2019).

* cited by examiner

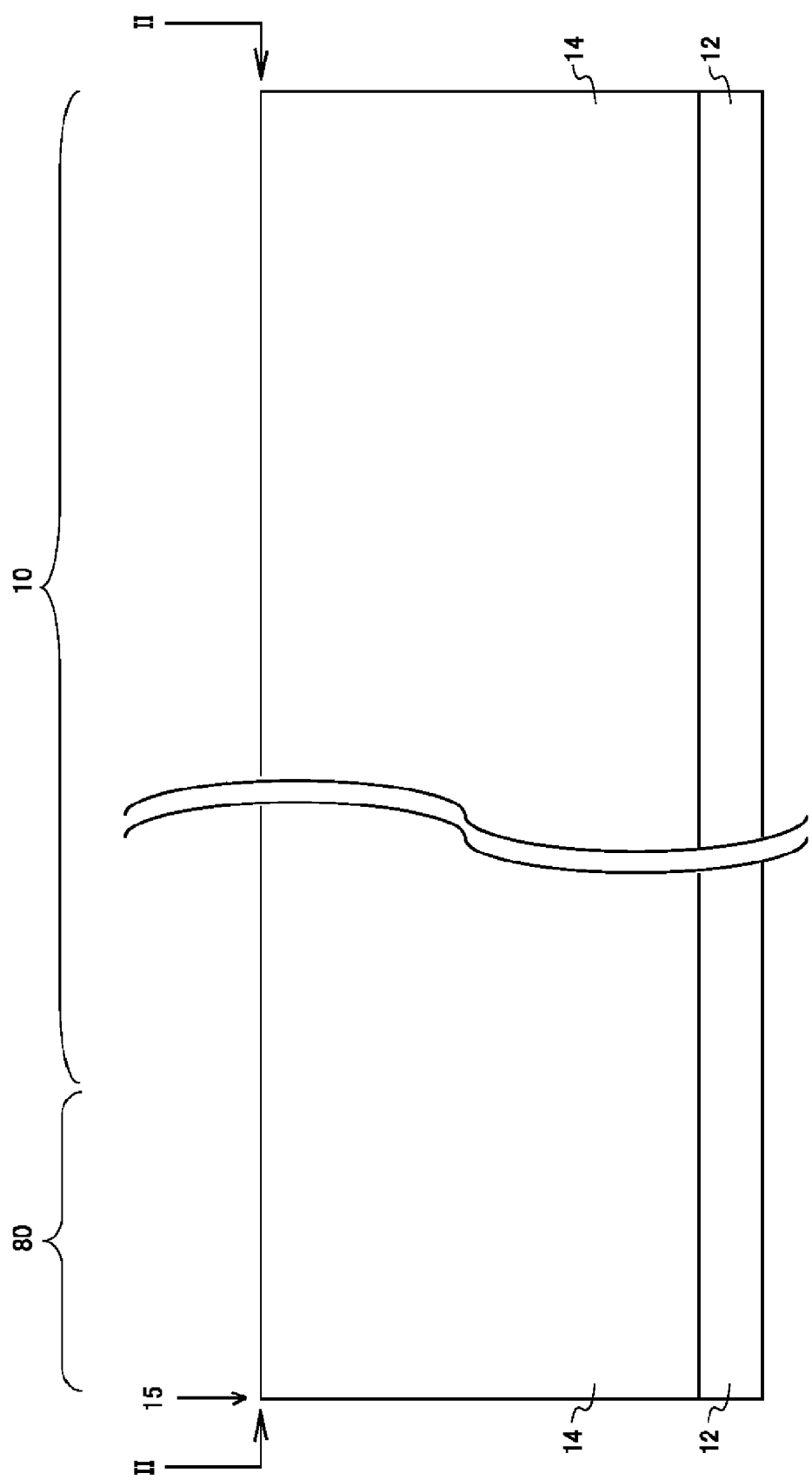

SEMICONDUCTOR DEVICE AND METHOD OF MANUFACTURING SEMICONDUCTOR DEVICE

The contents of the following Japanese patent application are incorporated herein by reference:

NO. 2015-098744 filed on May 14, 2015.

BACKGROUND

1. Technical Field

The present invention relates to a semiconductor device and a method of manufacturing a semiconductor device.

2. Related Art

In the conventional art, etching is performed on a semiconductor substrate to form a trench in the semiconductor substrate and an epitaxial layer is further formed in the trench (see, for example, Japanese Patent Application Publications Nos. 2005-32792, 59-69943, and 2007-329385. Furthermore, it is known to provide a field oxide film in a semiconductor substrate in a surrounding portion adjacent to an active portion (for example, see Japanese Patent Application Publication No. 5-55262) and to provide a LOCOS isolation region in a semiconductor substrate (see, for example, Japanese Patent Application Publication No. 1-246844).

When the impurity concentration of the semiconductor layer in which the trench is formed by the etching is comparable to that of the epitaxial layer that is further formed in the trench, electrical fields can concentrate on the bottom of the trench.

SUMMARY

A first aspect of the innovations herein may include a semiconductor device including a first semiconductor layer containing impurities of a first conductivity type, a trench provided in the first semiconductor layer on a front surface side, and a second semiconductor layer provided on an inner wall of the trench, the second semiconductor layer containing impurities of the first conductivity type at a lower concentration than the first semiconductor layer.

The first semiconductor layer may have an impurity concentration of no less than $4E14$ cm$^{-3}$ and no more than $7E16$ cm$^{-3}$, and the second semiconductor layer may have an impurity concentration of no less than $3.2E14$ cm$^{-3}$ and no more than $4.5E16$ cm$^{-3}$.

A thickness of the second semiconductor layer may be no less than 27.3% and no more than 36.4% of a width of the trench.

The second semiconductor layer may extend to reach an edge of the front surface of the first semiconductor layer.

The semiconductor device may further include an oxide region provided in the second semiconductor layer in a region including the edge.

The second semiconductor layer may include a low-concentration impurity region, and a high-concentration impurity region formed in a region closer to the trench than the low-concentration impurity region is, where the high-concentration impurity region has a higher impurity concentration than the low-concentration impurity region.

The semiconductor device may further include a trench insulating film provided within the trench, where the trench insulating film is in contact with the second semiconductor layer, and a trench electrode provided within the trench, where the trench electrode is in contact with the trench insulating film.

A second aspect of the innovations herein may provide a method of manufacturing a semiconductor device, including forming a first semiconductor layer containing impurities of a first conductivity type, forming a trench in the first semiconductor layer on a front surface side thereof, and forming a second semiconductor layer on an inner wall of the trench, the second semiconductor layer containing impurities of the first conductivity type at a lower concentration than the first semiconductor layer.

The method of manufacturing a semiconductor device may further include, subsequent to the forming the second semiconductor layer, forming an oxide region in the second semiconductor layer in a region including an edge of the second semiconductor layer.

The method of manufacturing a semiconductor device may further include, subsequent to the forming the second semiconductor layer and prior to the forming the oxide region, forming a first insulating film on a front surface of the second semiconductor layer, and subsequent to the forming the first insulating film, forming a second insulating film on a front surface of the first insulating film, the second insulating film exhibiting etch selectivity with respect to the first insulating film. Here, in the forming the oxide region, subsequent to the forming the second insulating film, the second insulating film in the region including the edge may be partially removed and the oxide region may be formed in the region from which the second insulating film has been partially removed.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

BRIEF DESCRIPTION OF THE DRAWINGS

FIG. 3A shows a step of forming a first epitaxial layer 14.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
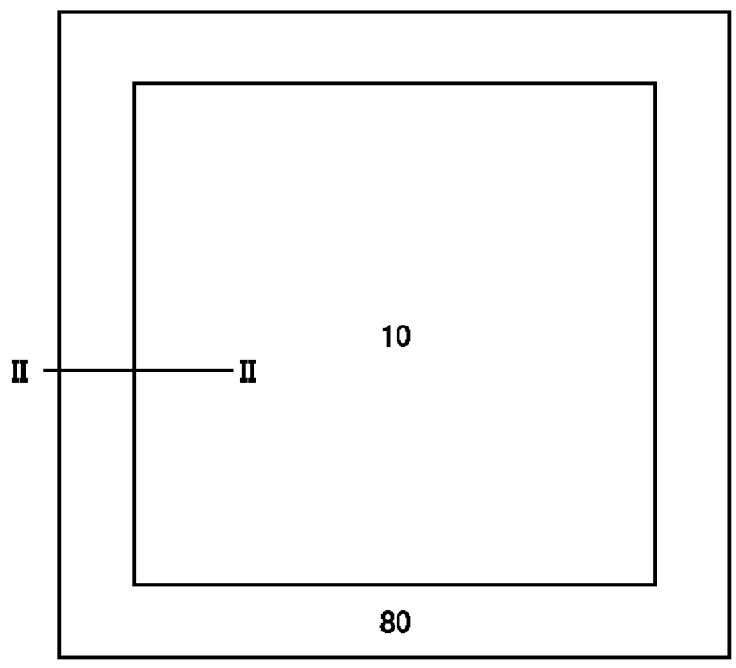
FIG. 1 is a schematic top view of a semiconductor device 100 according to a first embodiment.

FIG. 1 is a top schematic view illustrating a semiconductor device 100 according to a first embodiment. According to the present exemplary embodiment, the semiconductor device 100 is a semiconductor chip including an active portion 10 and a surrounding portion 80. The active portion 10 has therein a metal oxide semiconductor field effect transistor (MOSFET) element, an insulated gate bipolar transistor (IGBT) element or the like. The surrounding portion 80 surrounds the active portion 10 and has therein a breakdown voltage structure.

Figure 2:
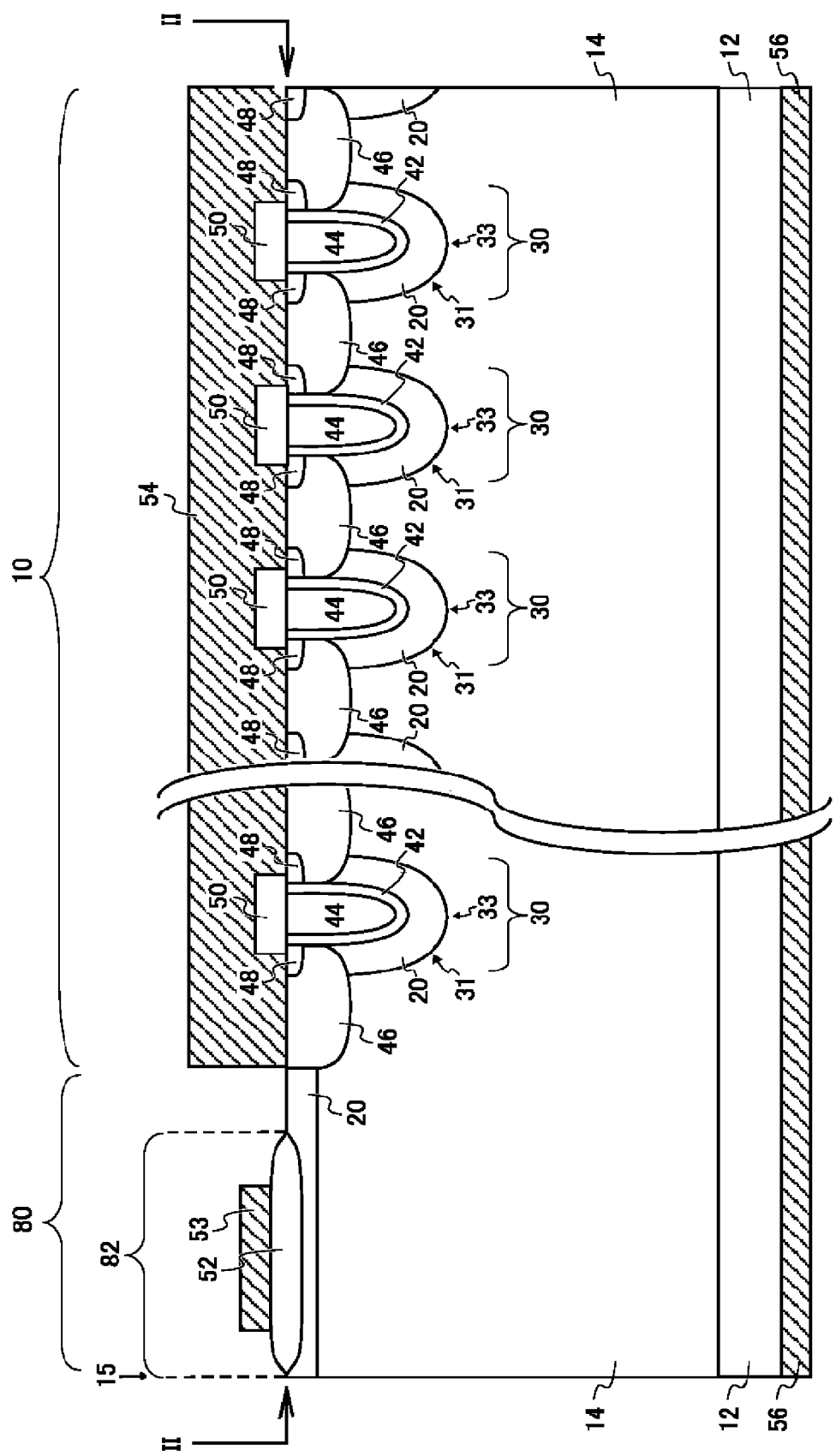
FIG. 2 is a schematic cross-sectional view showing the semiconductor device 100 along II-II in FIG. 1.

FIG. 2 is a schematic cross-sectional view showing the semiconductor device 100 along II-II in FIG. 1. In the present specification, one of the surfaces of a first epitaxial layer 14 on which a source electrode 54 is provided is referred to as a front surface, and the other surface on which a semiconductor substrate 12 is provided is referred to as a back surface. Likewise, one of the surfaces of a second epitaxial layer 20 on which the source electrode 54 is provided is referred to as a front surface, and the other surface on which the first epitaxial layer 14 is provided is referred to as a back surface. Likewise, one of the surfaces of the semiconductor substrate 12 on which the first epitaxial layer 14 is provided is referred to as a front surface, and the other surface on which a drain electrode 56 is provided is referred to as a back surface. The definitions of the front and back surfaces may analogically apply to the curved surfaces of a trench. In the present exemplary embodiment, a first conductivity type indicates the n-type, and a second conductivity type indicates the p-type. In other exemplary embodiments, however, the first conductivity type may indicate the p-type and the second conductivity type may indicate the n-type.

In the semiconductor device 100 according to the present exemplary embodiment, a trench-gate MOSFET is in the active portion 10, and a local oxidation of silicon (LOCOS) region 52, which is an oxide region, and a field plate electrode (hereinafter, referred to as the FP electrode) 53 are in the surrounding portion 80. The semiconductor substrate 12 is a silicon substrate in the present exemplary embodiment but may be a silicon carbide (SiC) substrate in other exemplary embodiments.

The semiconductor device 100 includes the semiconductor substrate 12, the first epitaxial layer 14, which is a first semiconductor layer, and a second epitaxial layer 20, which is a second semiconductor layer. The semiconductor device 100 further includes a trench 30, a trench insulating film 42, a trench electrode 44, a second-conductivity-type well 46, a first-conductivity-type source region 48, an inter-layer insulating film 50, the source electrode 54 and the drain electrode 56.

The semiconductor substrate 12 and the first epitaxial layer 14 both contain impurities of the first conductivity type. The first epitaxial layer 14 is epitaxially grown on the front surface of the semiconductor substrate 12 and has a lower impurity concentration than the semiconductor substrate 12. The impurity concentration of the first epitaxial layer 14 may be determined according to the breakdown voltage of the semiconductor device 100. In the present exemplary embodiment, the first epitaxial layer 14 may have an impurity concentration of no less than 4E14 $cm^{-3}$ and no more than 7E16 $cm^{-3}$. Here, the letter "E" means powers of 10. For example, E14 means 10 to the power of 14.

Since the first epitaxial layer 14 according to the present exemplary embodiment mainly contains silicon, the n-type impurities may be phosphorous (P) or arsenic (As) and the p-type impurities may be boron (B) or aluminum (Al). When the first epitaxial layer 14 is made of SiC, the n-type impurities may be phosphorous (P) or nitrogen (N) and the p-type impurities may be aluminum (Al) or boron (B).

The first epitaxial layer 14 has therein a plurality of trenches 30 on the front surface side of the active portion 10. The trenches 30 have the second epitaxial layers 20 provided on inner walls 31 thereof. The second epitaxial layers 20 contain the first-conductivity-type impurities at a lower concentration than the first epitaxial layer 14.

In the present exemplary embodiment, the second epitaxial layer 20 contains the first-conductivity-type impurities at a lower concentration than the first epitaxial layer 14. The impurity concentration of the second epitaxial layer 20 may be no less than 3.2E14 $cm^{-3}$ and no more than 4.5E16 $cm^{-3}$. The second epitaxial layer 20 extends to an edge 15 of the front surface of the first epitaxial layer 14. In a region 82 including the edge 15, the LOCOS region 52 is provided in the second epitaxial layer 20. In the present specification, the region 82 including the edge 15 is defined in the surrounding portion 80 to have a certain width from the edge 15 toward the active portion 10.

The FP electrode 53 is provided on the front surface of the LOCOS region 52. When a voltage lower than the voltage being applied to the first and second epitaxial layers 14 and 20 is applied to the FP electrode 53, the portions of the first and second epitaxial layers 14 and 20 that are in the vicinity of the FP electrode 53 are depleted. Thus, the depletion layer is allowed to easily extend from the active portion 10 to the surrounding portion 80. In particular, the depletion layer can easily extend in the second epitaxial layer 20, which has a lower impurity concentration than the first epitaxial layer 14. This lowers the electrical field strength within the depletion layer in the surrounding portion 80 and can accordingly improve the breakdown voltage of the semiconductor device 100.

Within the trench 30, the trench insulating film 42 is in contact with the second epitaxial layer 20, and the trench electrode 44 is in contact with the trench insulating film 42. Hereinafter, the trench insulating film 42 and the trench electrode 44 will be collectively referred to as a trench structure for convenience. The inter-layer insulating film 50 prevents electrical connection between the trench electrode 44 and the source electrode 54.

The second-conductivity-type wells 46 are provided on both sides of each trench structure. Here, adjacent trench structures share one second-conductivity-type well 46 therebetween. The first-conductivity-type source regions 48 are also provided on both sides of each trench structure. When a positive voltage of an appropriate level to turn on the semiconductor device 100 is applied to the trench electrodes 44, an inversion layer is formed in the second-conductivity-type wells 46, which are in contact with the trench structures. Furthermore, when there is an appropriate potential difference between the source electrode 54 and the drain electrode 56, currents flow from the drain electrode 56 into the source electrode 54 through the inversion layers and the first-conductivity-type source regions 48. In the present exemplary embodiment, the trench electrodes 44 are gate electrodes.

In the present exemplary embodiment, the second epitaxial layers 20 are also provided on bottoms 33 of the U-shaped inner walls 31 of the trenches 30. As described above, the second epitaxial layer 20 has a lower concentration of the first-conductive-type impurities than the first epitaxial layer 14. Here, in the PN junction, as the impurity concentration drops, the depletion layer is likely to extend more broadly. Since the trenches 30 of the present exemplary embodiment have the second epitaxial layers 20 at the bottoms 33 thereof, the depletion layer also broadly extends at the bottoms 33 of the trenches 30. Accordingly, the electrical field strength of the depletion layer is also reduced at the bottoms 33 of the trenches 30, which resultantly improves the breakdown voltage of the semiconductor device 100. In addition, the present exemplary embodiment can have minute trench structures since the trenches 30 are structured therein in such a manner that the trench insulating films 42 are in contact with the second epitaxial layers 20 and the trench electrodes 44 are in contact with the trench insulating films 42.

Figure 3B:
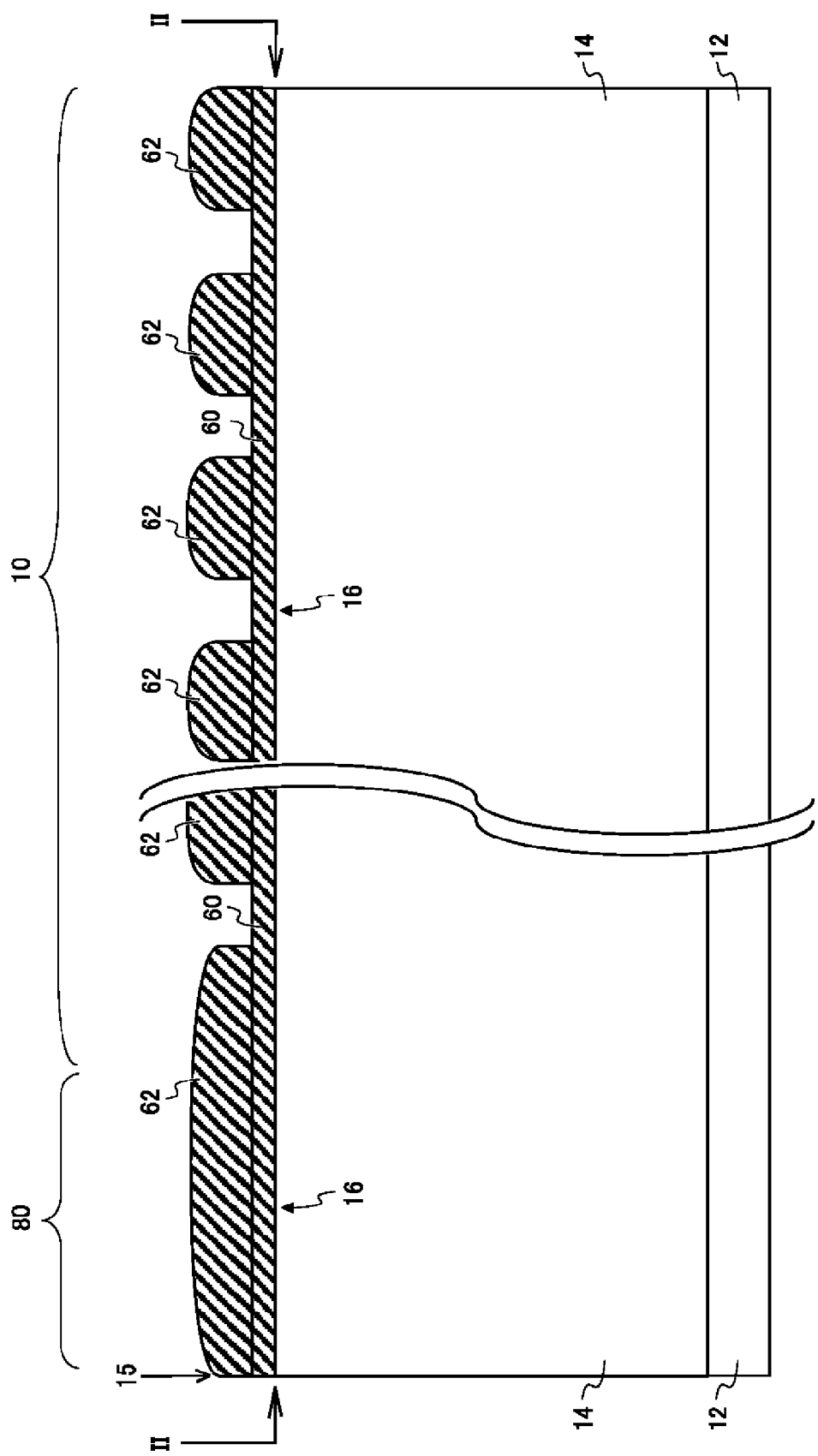
FIG. 3B shows a step of forming a silicon oxide film 60 and a photoresist layer 62.

FIGS. 3A to 3I show a process of manufacturing the semiconductor device 100. FIG. 3A shows a step of forming the first epitaxial layer 14. The semiconductor substrate 12 having a flat surface may be heated to a temperature of 1000° C. or higher and exposed to a gas such as monosilane ($SiH_4$), disilane ($Si_2H_6$), dichlorosilane ($SiH_2Cl_2$) and trichlorosilane ($SiHCl_3$) to form the first epitaxial layer 14 of no less than 4.0 μm and no more than 15 μm. The thickness of the first epitaxial layer 14 is determined depending on the breakdown voltage of the semiconductor device 100. Although the first epitaxial layer 14 absorbs the first-conductivity-type impurities in the semiconductor substrate 12 while growing, the first epitaxial layer 14 has a lower impurity concentration than the semiconductor substrate 12.

FIG. 3B shows a step of forming a silicon oxide film 60 and a photoresist layer 62. The step shown in FIG. 3B is subsequent to the step shown in FIG. 3A. The silicon oxide film 60 is formed on the entire front surface 16 of the first epitaxial layer 14 using a technique such as plasma CVD. After this, the photoresist layer 62 is deposited using photolithography and patterned by exposure. Subsequently, a portion of the silicon oxide film 60 that is not covered with the photoresist layer 62 is removed by etching.

Figure 3C:
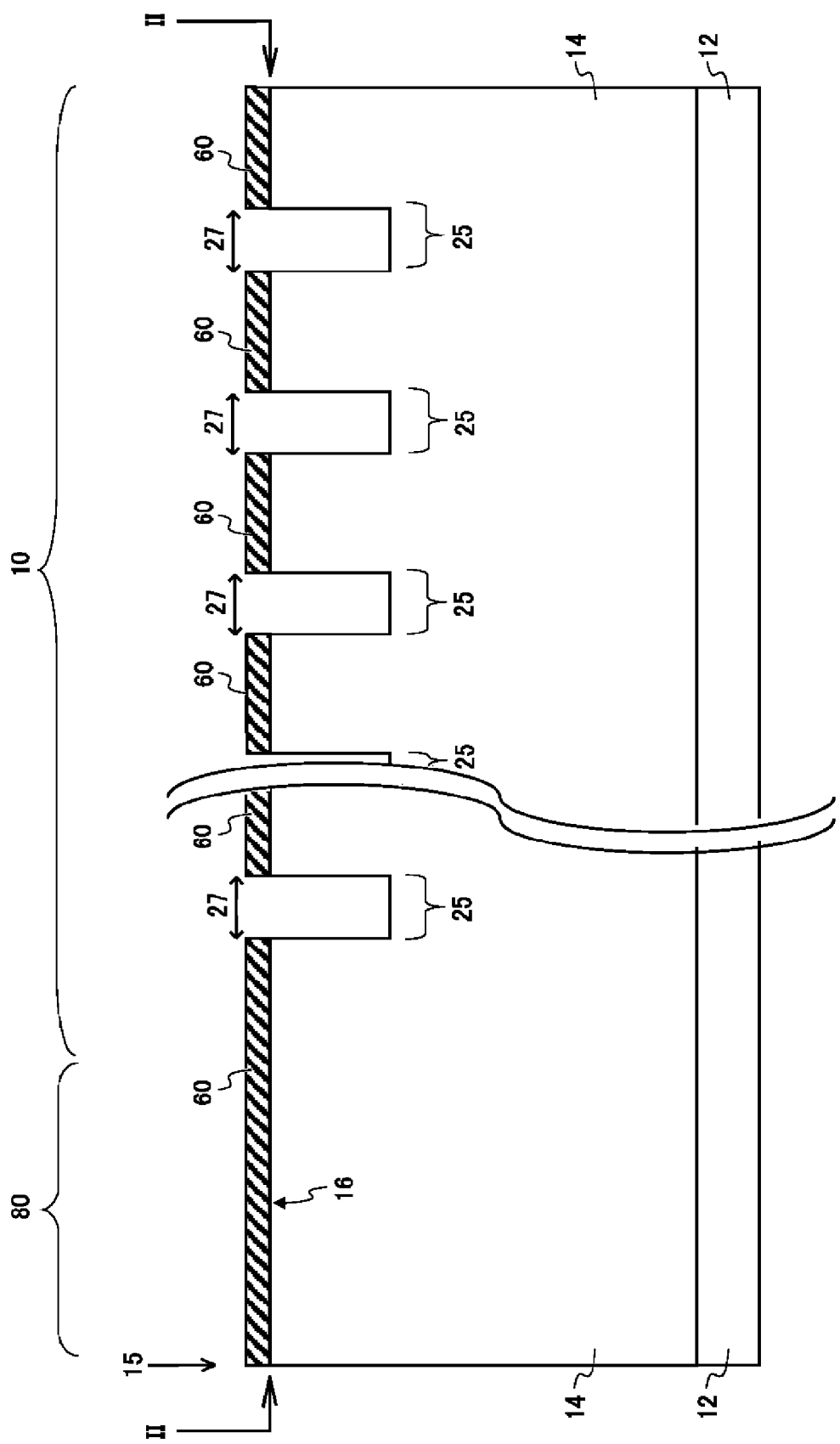
FIG. 3C shows a step of etching the first epitaxial layer 14 through the silicon oxide film 60.

FIG. 3C shows a step of etching the first epitaxial layer 14 through the silicon oxide film 60. The step shown in FIG. 3C is subsequent to the step shown in FIG. 3B. As a result of the step shown in FIG. 3B, the front surface 16 of the first epitaxial layer 14 is externally exposed in the regions from which the silicon oxide film 60 is removed. Using the silicon oxide film 60 as a mask, the exposed first epitaxial layer 14 is subjected to etching and trenches 25 are resultantly formed. The present exemplary embodiment does not use the organic photoresist layer 62 as the etching mask for the trenches 30 and thus prevents organic matters from entering the trenches 25. Accordingly, the present exemplary embodiment can avoid adverse effects on the channel characteristics on the MOSFET. For example, the diffusions of the organic matters into the trenches may generate defects and mobile ions, increase the leakage currents, change the characteristics including the parameter $V_{th}$, lower the maximum currents, and compromise the reliability of the gate. At the end of this step, the trenches 25 may have a width 27 of no less than 0.8 μm and no more than 1.2 μm.

Figure 3D:
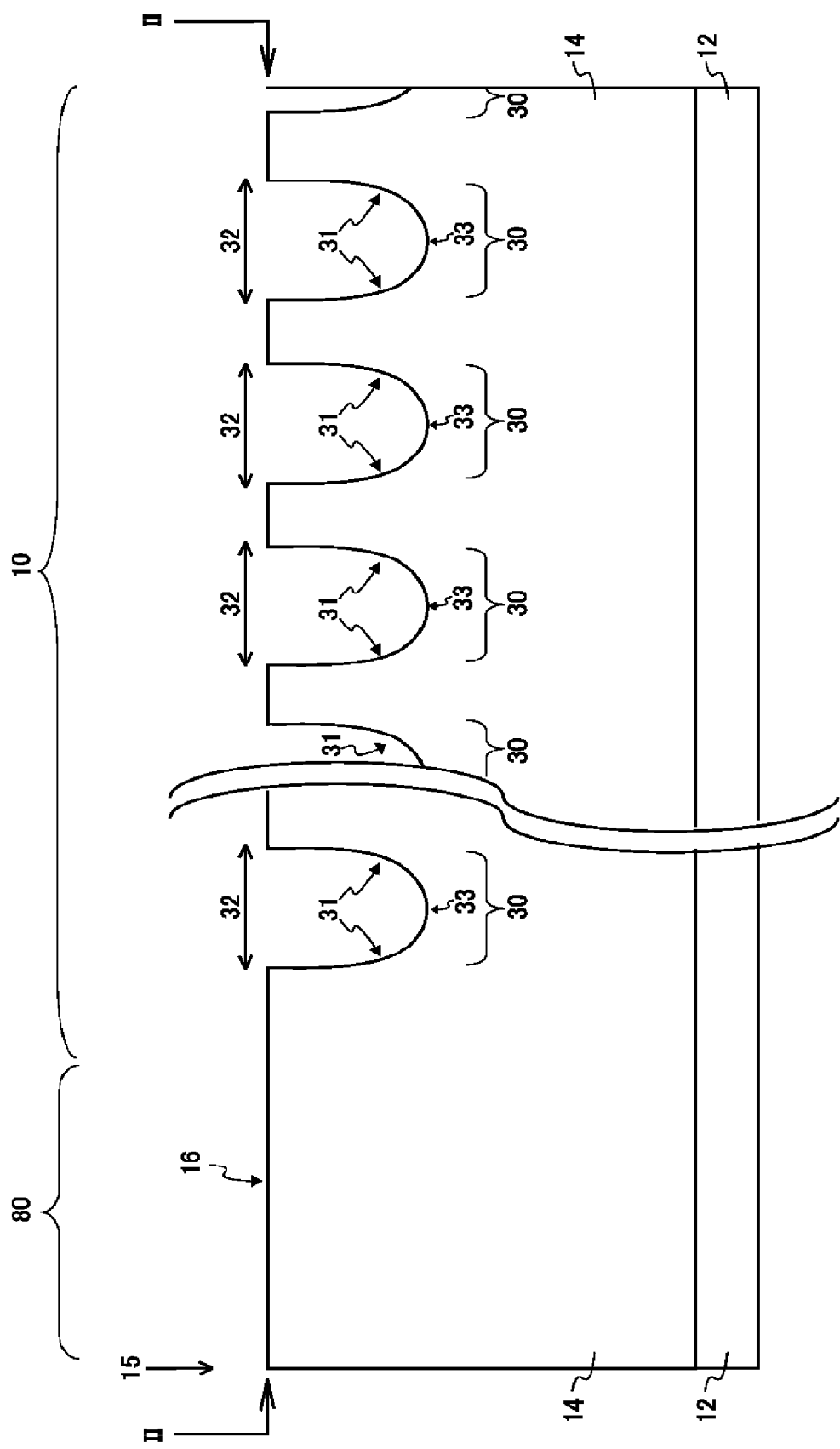
FIG. 3D shows a step of forming trenches 30 by removing damages.

FIG. 3D shows a step of forming the trenches 30 by performing a step of removing damages. The step shown in FIG. 3D is subsequent to the step shown in FIG. 3C. The trenches 25 formed as a result of the step shown in FIG. 3C have damaged layers, which include surface roughness and the like attributable to the etching. The damaged layers may cause crystal defects and the like in the channel region and thus are undesirable. To address this issue, sacrificial oxide layers are formed within the trenches 25 by wet oxidation or thermal oxidation. The sacrificial oxide layers are then removed by etching. In this manner, the step of removing the damages is completed and the trenches 30 are formed in the first epitaxial layer 14 on the front surface side.

The step of removing the damages increases the width 27 of the trenches 25 by approximately 0.3 μm. In other words, the step of removing the damages forms the trenches 30, which have a width 32 of, for example, no less than 1.1 μm and no more than 1.5 μm.

Figure 3E:
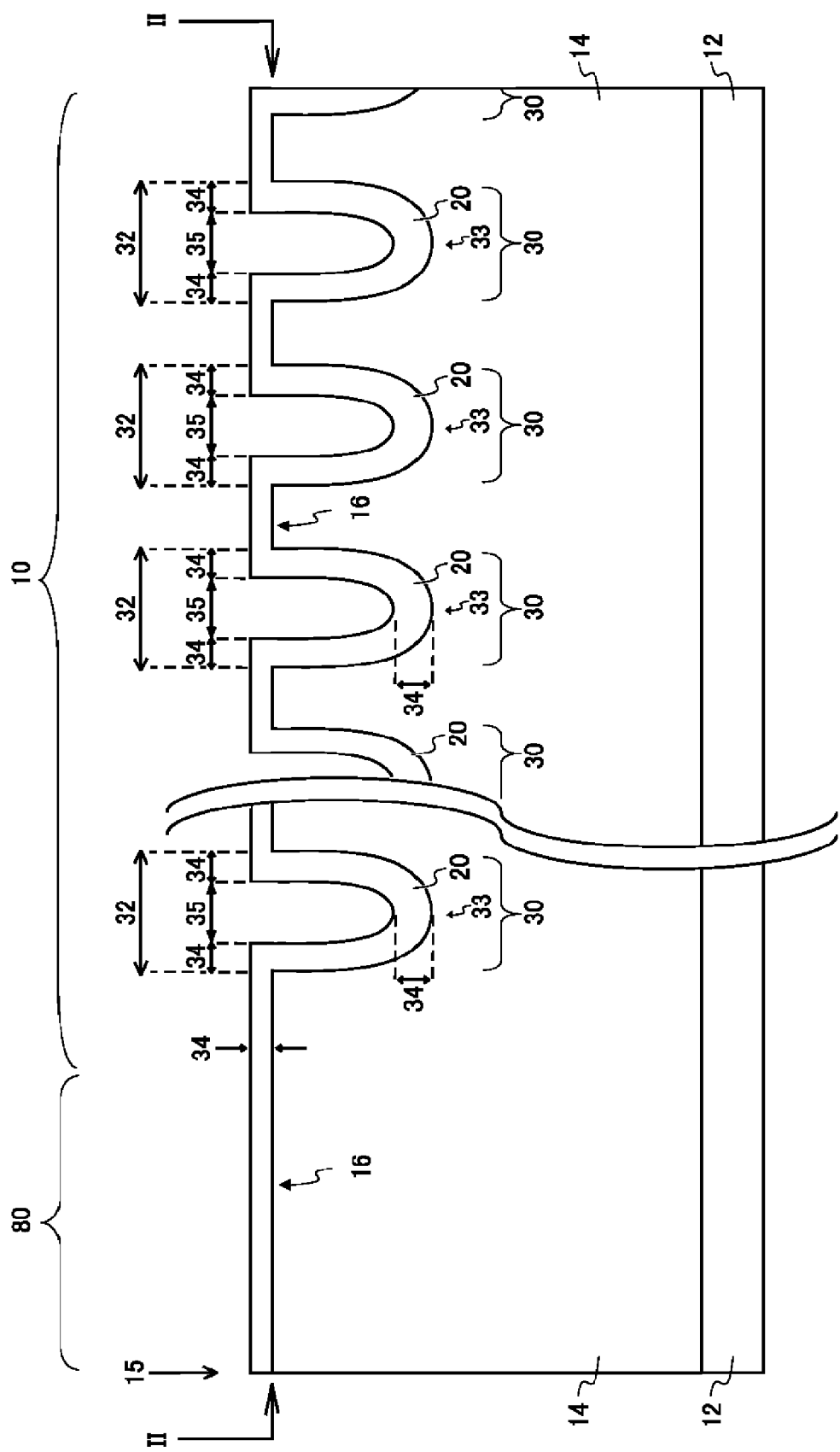
FIG. 3E shows a step of forming a second epitaxial layer 20.

FIG. 3E shows a step of forming the second epitaxial layer 20. The step shown in FIG. 3E is subsequent to the step shown in FIG. 3D. In this step, a silicon film is epitaxially grown on the front surface 16 of the first epitaxial layer 14 and the inner walls 31 of the trenches 30 to form the second epitaxial layer 20. For example, when the width 32 of the trenches 30 formed by the step shown in FIG. 3D is 1.1 μm, a silicon film of approximately 0.3 μm is epitaxially grown. On the other hand, when the width 32 of the trenches 30 formed by the step shown in FIG. 3D is 1.3 μm, a silicon film of approximately 0.4 μm is epitaxially grown. The resultant width 35 of the trenches 30 is approximately 0.5 μm.

The method to form the second epitaxial layer 20 may be the same as the method to form the first epitaxial layer 14 (see FIG. 3A). Although the second epitaxial layer 20 absorbs the impurities of the first conductivity type in the first epitaxial layer 14 while growing, the second epitaxial layer 20 has a lower impurity concentration than the first epitaxial layer 14. In the present exemplary embodiment, the width 35 of the trenches 30 that can be achieved by a standard exposure apparatus having a resolution of 1 μm (in the present exemplary embodiment, 0.5 μm) is comparable to the width 35 of the trenches 30 that can be achieved by an expensive exposure apparatus having a resolution of 0.5 μm.

In the present exemplary embodiment, a thickness 34 of the second epitaxial layer 20 in the trenches 30 and the surrounding portion 80 is no less than 0.3 μm and no more than 0.4 μm. Stated differently, the thickness 34 of the second epitaxial layers 20 is no less than 27.3% (=0.3 μm/1.1 μm) and no more than 36.4% (=0.4 μm) of the width 32 of the trenches 30 in the first epitaxial layers 14.

Figure 3F:
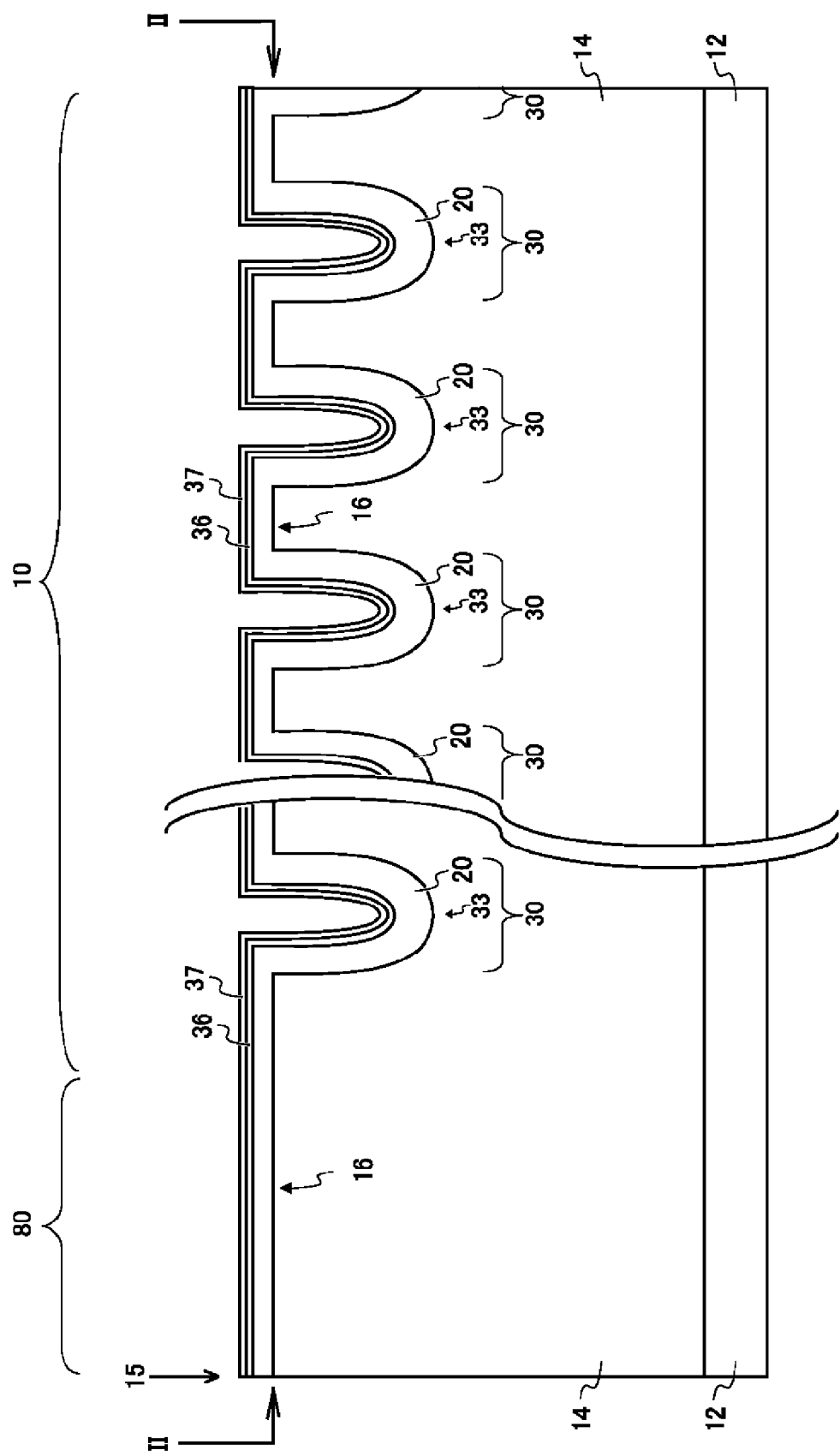
FIG. 3F shows a step of forming a silicon oxide film 36 and a silicon nitride film 37 in the stated order.

FIG. 3F shows a step of forming a silicon oxide film 36 and a silicon nitride film 37 in the stated order. The step shown in FIG. 3F is subsequent to the step shown in FIG. 3E. This step forms the silicon oxide film 36 having a thickness of, for example, no less than 200 angstroms and no more than 400 angstroms, as a first insulating film, on the front surface side of the second epitaxial layer 20. After this, the silicon nitride film 37 having a thickness of, for example, approximately 1000 angstroms to 2000 angstroms is formed as a second insulating film on the front surface side of the silicon oxide film 36. The silicon oxide film 36 and the silicon nitride film 37 are provided on the entire second epitaxial layer 20 using a technique such as plasma CVD, for example. This means that the silicon oxide film 36 and the silicon nitride film 37 are provided in the flat surrounding portion 80 and, additionally, in both the flat regions and the trenches 30 in the active portion 10.

Figure 3G:
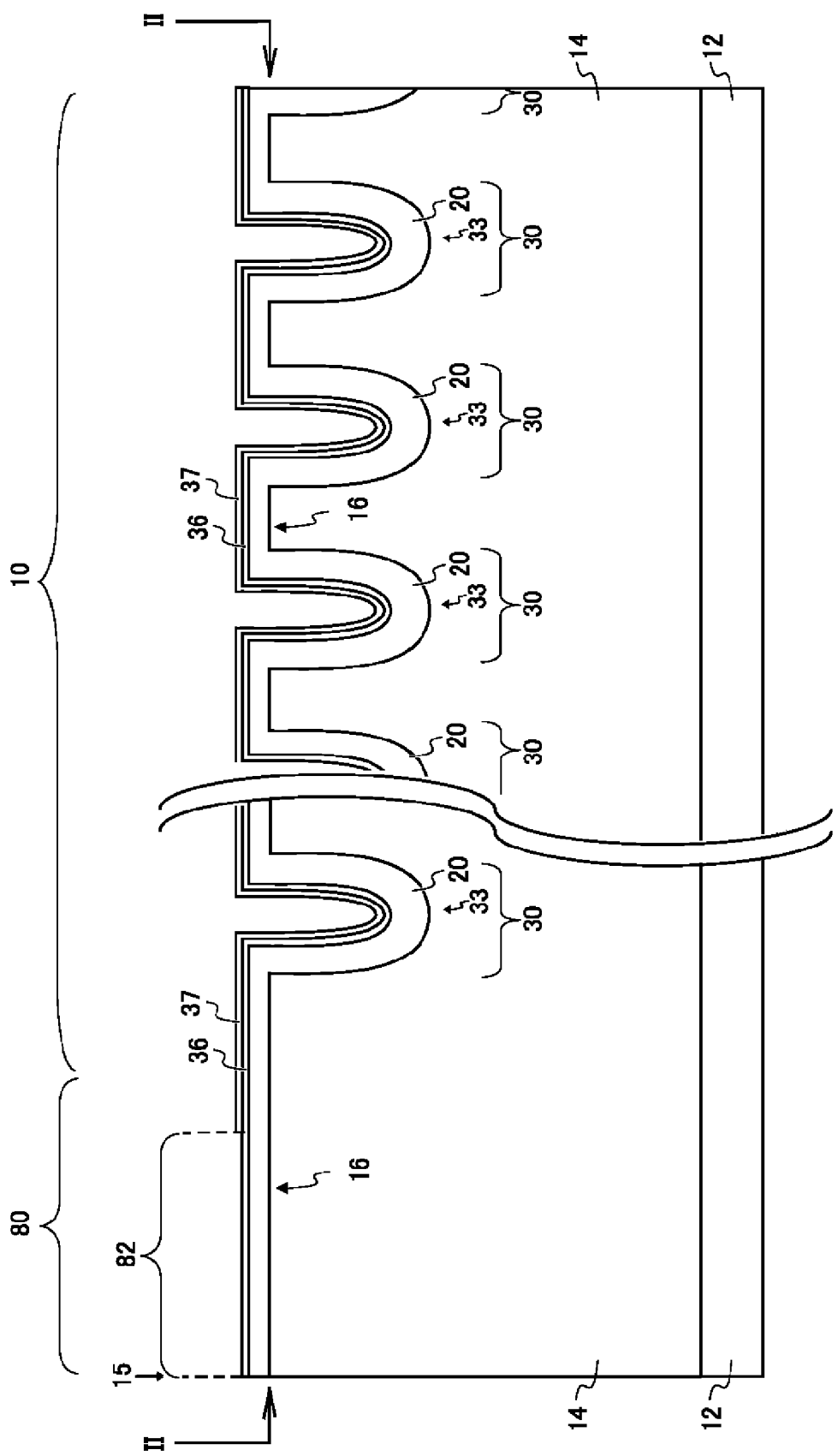
FIG. 3G shows a step of partially removing the silicon nitride film 37.

FIG. 3G shows a step of partially removing the silicon nitride film 37. The step shown in FIG. 3G is subsequent to the step shown in FIG. 3F. The silicon nitride film 37 exhibits etch selectivity with respect to the silicon oxide film 36, which is the first insulating film. In this step, the silicon oxide film 36 serves as an etching stopper for the silicon nitride film 37. Accordingly, this step can only partially remove a portion of the silicon nitride film 37 corresponding to the region 82 including the edge 15. In the present exemplary embodiment, after the silicon nitride film 37 is partially removed, the silicon oxide film 36 that is externally exposed in the region 82 is not removed. In other exemplary embodiments, however, the externally exposed silicon oxide film 36 may be removed using dilute hydrofluoric acid.

Figure 3H:
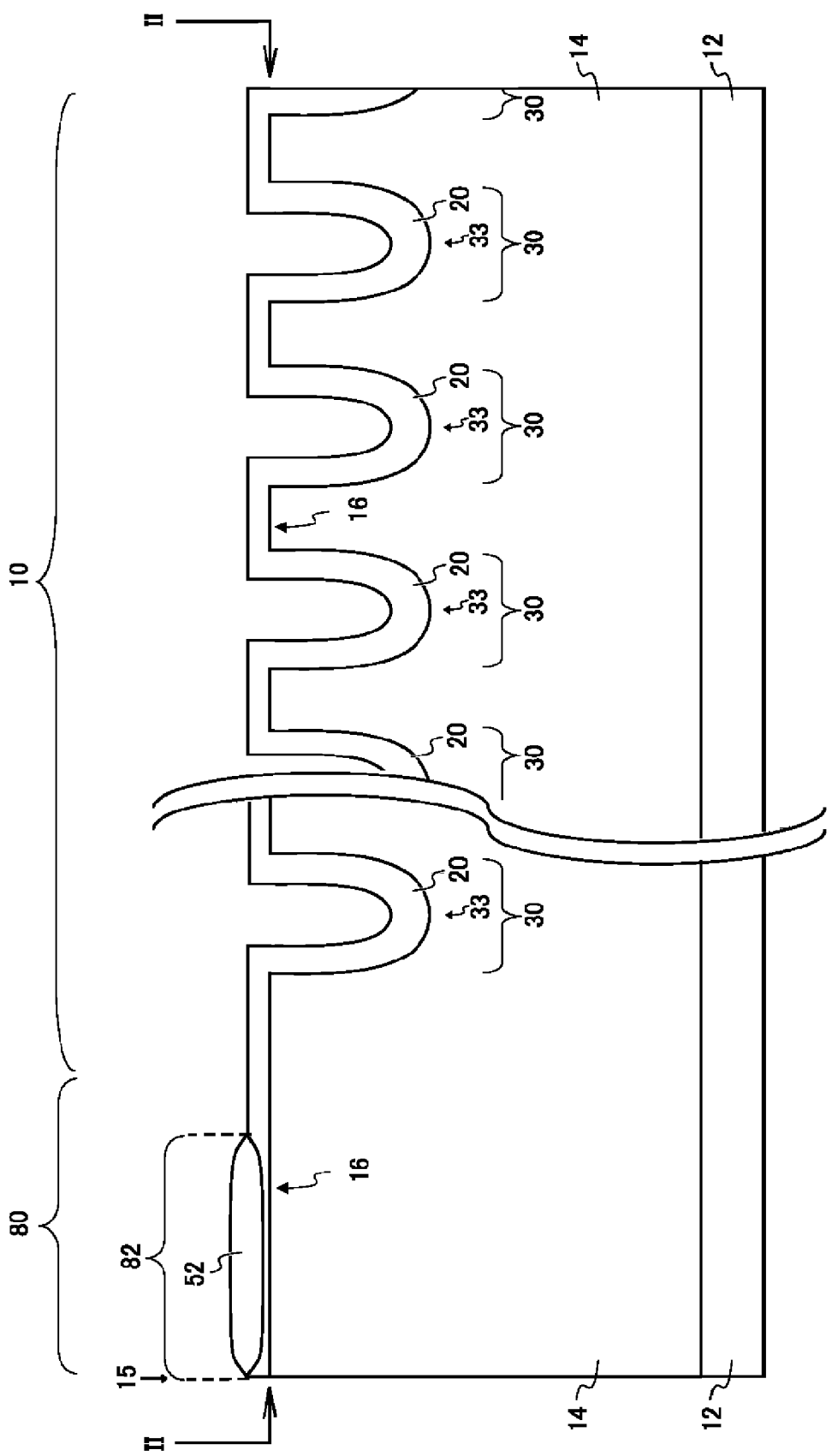
FIG. 3H shows a step of forming a LOCOS region 52.

FIG. 3H shows a step of forming the LOCOS region 52. The step shown in FIG. 3H is subsequent to the step shown in FIG. 3G. The silicon nitride film 37 serves as a mask to selectively form the LOCOS region 52 in the second epitaxial layer 20. The LOCOS region 52 is formed in the region 82 including the edge 15 from which the silicon nitride film 37 has been partially removed by exposing the first epitaxial layer 14 to an atmosphere of, for example, approximately no less than 800° C. and no more than 1100° C. (thermal oxidation). After the LOCOS region 52 is formed, the silicon oxide film 36 and the silicon nitride film 37 are removed by etching.

In the present exemplary embodiment, the formation of the trenches 30 (FIG. 3B to FIG. 3E) is performed prior to the formation of the LOCOS region 52 (FIG. 3H). If the order is reversed, that is to say, the formation of the LOCOS region 52 (FIG. 3H) is performed prior to the formation of the trenches 30 (FIG. 3B to FIG. 3E), the inclined planes in the LOCOS region 52, for example, the bird's beak can cause standing wave effects during the photolithography process (FIG. 3B). If the standing wave effects occur, the photoresist layer 62 cannot be patterned as desired. In addition, in order to prevent the standing wave effects, additional steps are required to, for example, further provide an anti-reflective layer. The present exemplary embodiment is not affected by the standing wave effects since the formation of the trenches 30 (FIG. 3B to FIG. 3E) is performed prior to the formation of the LOCOS region 52 (FIG. 3H). This makes it possible to accurately form the trenches 30 even when the width 35 is 1 μm or less.

It may be possible to perform the step of forming the LOCOS region 52 by depositing a silicon oxide film in place of the thermal oxidation. In this case, however, the deposited silicon oxide film needs to be removed from within the trenches 30 in subsequent steps to leave only a portion of the silicon oxide film in the region 82. The deposited silicon oxide film has a larger thickness than the silicon oxide film 36 and the silicon nitride film 37. Therefore, the removal of the deposited silicon oxide film may also etch away the second epitaxial layer 20 in the trenches 30, which may impair the advantages of the minute width achieved for the trenches 30. For these reasons, it is desirable to employ thermal oxidation for this step.

The edge of the LOCOS region 52 closer to the active portion 10 may be spaced away by 30 μm or more from one of the trenches 30, in the active portion 10, that is the closest to the surrounding portion 80. It should be noted that, for the sake of clarity, the distance between the edge of the LOCOS region 52 closer to the active portion 10 and one of the trenches 30 that is closest to the surrounding portion 80 is shown shorter than the actual distance in the drawings.

Figure 3I:
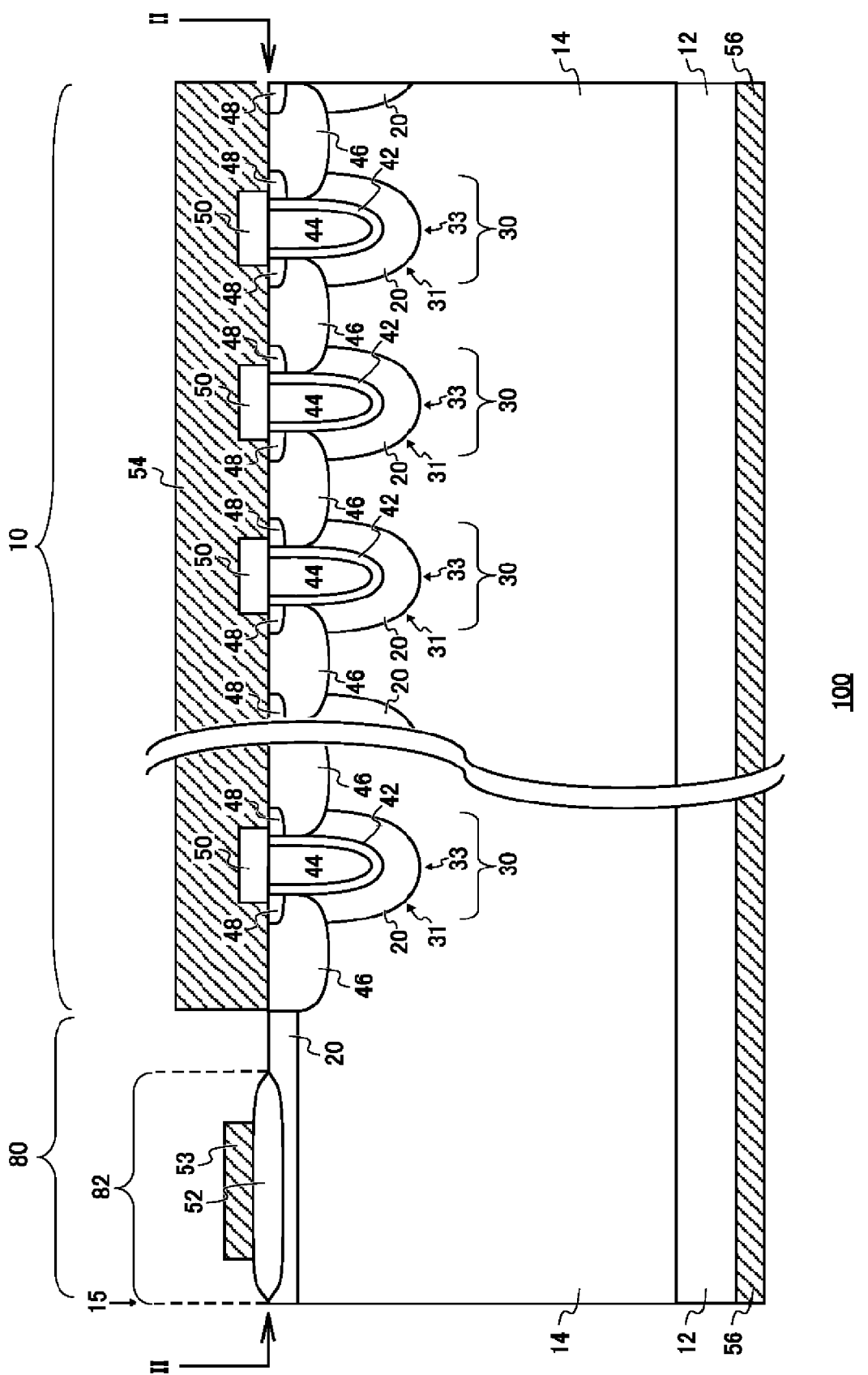
FIG. 3I shows a step of providing second-conductivity-type wells 46, first-conductivity-type source regions 48, inter-layer insulating films 50, a source electrode 54 and a drain electrode 56.

FIG. 3I shows a step of providing the second-conductivity-type well 46, the first-conductivity-type source region 48, the inter-layer insulating film 50, the source electrode 54 and the drain electrode 56. The step shown in FIG. 3I is subsequent to the step shown in FIG. 3H. In this step, a plurality of second-conductivity-type wells 46 and a plurality of first-conductivity-type source regions 48 are formed in the first epitaxial layer 14 and the second epitaxial layer 20 using a known technique such as ion implantation.

Subsequently, the trench insulating film 42 and the trench electrode 44 are sequentially formed. The trench insulating film 42 may be a silicon oxide film and the trench electrode 44 may be made of polysilicon doped with impurities. Furthermore, the inter-layer insulating film 50 is provided on the front surface of the trench structure. Following this, the source electrode 54 is formed in the active portion 10, the FP electrode 53 is formed on the front surface of the LOCOS region 52, and the drain electrode 56 is formed on the back surface of the semiconductor substrate 12. The inter-layer insulating film 50 prevents electrical connection between the trench electrodes 44 and the source electrode 54.

Figure 4:
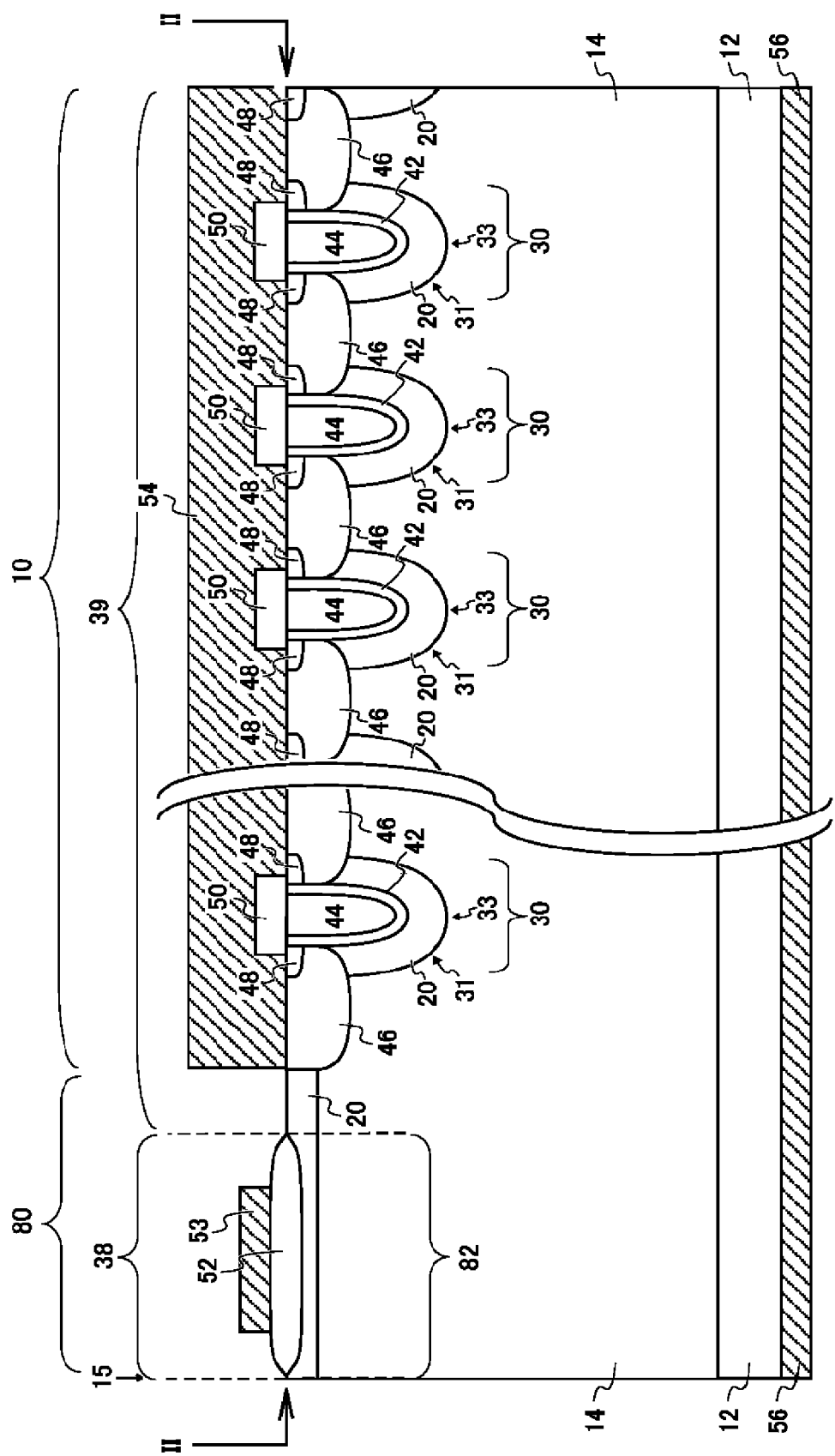
FIG. 4 is a schematic cross-sectional view showing a semiconductor device 200 according to a second embodiment.

FIG. 4 is a schematic cross-sectional view showing a semiconductor device 200 according to a second embodiment. In the semiconductor device 200, the second epitaxial layer 20 has a low-concentration impurity region 38 and a high-concentration impurity region 39. In this respect, the semiconductor device 200 is different from the semiconductor device 100 of the first embodiment. Except for this, the semiconductor device 200 is the same as the semiconductor device 100 of the first embodiment. In the second epitaxial layer 20, the low-concentration impurity region 38 is located in the region 82 including the edge 15. The high-concentration impurity region 39 is located closer to the trenches 30 than the low-concentration impurity region 38 is and has a higher impurity concentration than the low-concentration impurity region 38.

In the present exemplary embodiment, the impurity concentration of the low-concentration impurity region 38 is controlled lower than that of the high-concentration impurity region 39 by counter-doping the second epitaxial layer 20 of the first conductivity type with impurities of the second conductivity type. For example, the low-concentration impurity region 38 is additionally doped with the second-conductivity-type impurities of 8.0E13 to 1.2E16 cm$^{-3}$. In other exemplary embodiments, the different impurity concentrations may be achieved by, after the second epitaxial layer 20 of the first conductivity type is formed, additionally doping the high-concentration impurity region 39 with first impurities while not doping the low-concentration impurity region 38 with the first impurities. For example, the high-concentration impurity region 39 may be additionally doped with the first-conductivity-type impurities of 8.0E13 to 1.2E16 cm$^{-3}$. When such additional doping is performed, it is desirable to lower the impurity concentration of the first epitaxial layer 14 by approximately 20%.

Figure 5:
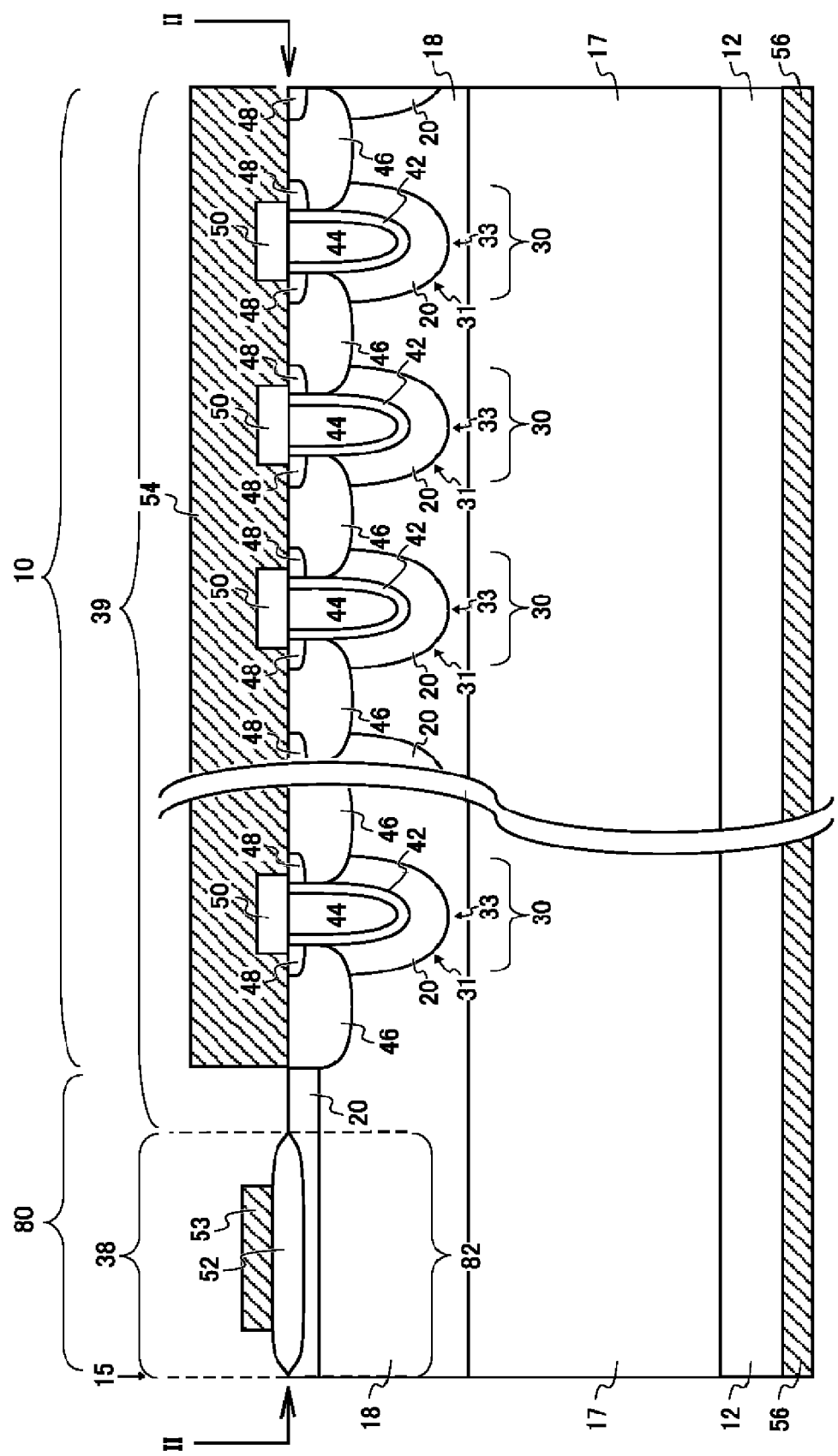
FIG. 5 is a schematic view showing a modification example of the second embodiment.

Here, when the additional doping is employed, the on resistance increases since the impurity concentration of the first epitaxial layer 14 needs to be controlled low. To address this issue, as shown in FIG. 5, a low-concentration epitaxial layer 18 having a lower impurity concentration than a first epitaxial layer 17 is formed on the upper surface of the first epitaxial layer 17. This can improve the characteristics.

FIG. 5 is a schematic view showing a modification example of the second embodiment. The first epitaxial layer 17 has the same concentration as the first epitaxial layer 14, and the low-concentration epitaxial layer 18 has an impurity concentration that is lower by 20% than that of the first epitaxial layer 17. The impurity concentration of the low-concentration epitaxial layer 18 may be the same as the impurity concentration of the second epitaxial layer 20. The thickness of the low-concentration epitaxial layer 18 may be determined such that the trench bottoms 33 can be formed within the low-concentration epitaxial layer 18. In this case, the counter-doping of the region 82, which will be described later, can be skipped.

With the above-described configurations, the portions of the low-concentration epitaxial layer 18 and the second epitaxial layer 20 that are in the vicinity of the FP electrode 53 are more easily depleted than in the first embodiment. Accordingly, the depletion layer can more easily extend from the active portion 10 to the surrounding portion 80 when compared with the first embodiment.

Figure 6:
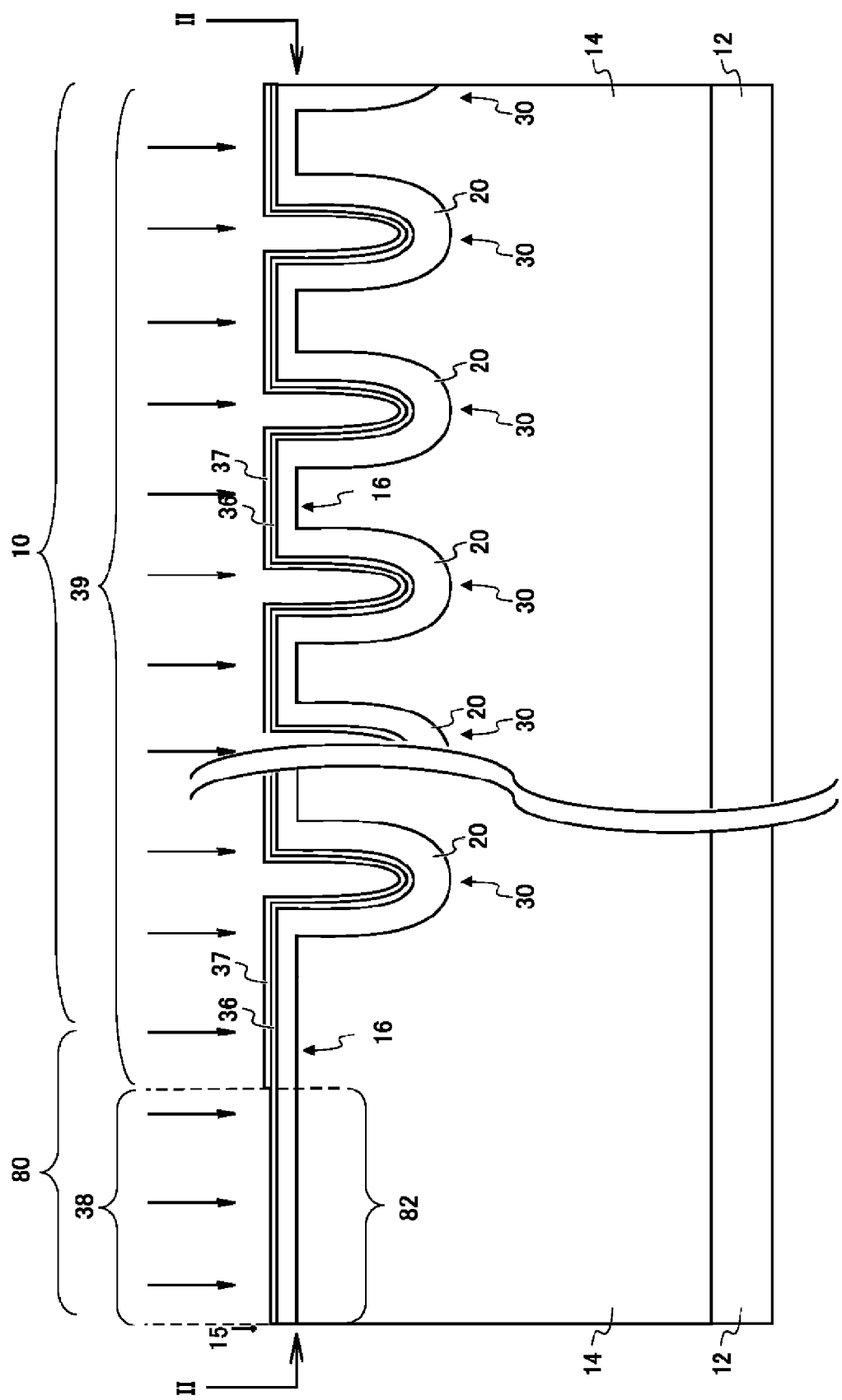
FIG. 6 shows a step of counter-doping a region 82 including an edge 15.

FIG. 6 shows a step of counter-doping the region 82 including the edge 15. This step may be performed between the step of partially removing the silicon nitride film 37 (FIG. 3G) and the step of forming the LOCOS region 52 (FIG. 3H) in the first embodiment. In the present exemplary embodiment, the region 82 is entirely doped with impurities of the second conductivity type from the front surface 16 side of the first epitaxial layer 14. In the region excluding the region 82 including the edge 15, the impurities are blocked by the silicon nitride film 37 from entering the silicon oxide film 36. Accordingly, only the region 82 including the edge 15 can be doped with the impurities of the second conductivity type.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

DESCRIPTIONS OF REFERENCE NUMERALS

10 . . . active portion, 12 . . . semiconductor substrate, 14 . . . first epitaxial layer, 15 . . . edge, 16 . . . front surface, 17 . . . first epitaxial layer, 18 . . . low-concentration epitaxial layer, 20 . . . second epitaxial layer, 25 . . . trench, 27 . . . width, 30 . . . trench, 31 . . . inner wall, 32 . . . width, 33 . . . bottom, 34 . . . thickness, 35 . . . width, 36 . . . silicon oxide film, 37 . . . silicon nitride film, 38 . . . low-concentration impurity region, 39 . . . high-concentration impurity region, 42 . . . trench insulating film, 44 . . . trench electrode, 46 . . . second-conductivity-type well, 48 . . . first-conductivity-type source region, 50 . . . inter-layer insulating film, 52 . . . LOCOS region, 53 . . . FP electrode, 54 . . . source electrode, 56 . . . drain electrode, 60 . . . silicon oxide film, 62 . . . photoresist layer, 80 . . . surrounding portion, 82 . . . region, 100 . . . semiconductor device, 200 . . . semiconductor device

What is claimed is:

1. A semiconductor device comprising:
    a semiconductor substrate containing impurities of a first conductivity type;
    a first semiconductor layer on a front surface of the semiconductor substrate, the first semiconductor layer containing impurities of a first conductivity type at a lower concentration than the impurities of the semiconductor substrate;
    a trench provided in the first semiconductor layer on a front surface side thereof; and
    a second semiconductor layer provided on an inner wall of the trench, the second semiconductor layer containing impurities of the first conductivity type at a lower concentration than the first semiconductor layer,
    wherein
    an area of the semiconductor device occupied by the semiconductor substrate from a schematic top view is divided between an active portion and a surrounding portion;
    the surrounding portion surrounds the active portion from the schematic top view;
    the surrounding portion does not include any trenches;
    the surrounding portion includes a LOCOS region such that the active portion and the LOCOS region do not overlap; and
    the second semiconductor layer extends to outer edges of the semiconductor substrate from the schematic top view.

2. The semiconductor device as set forth in claim 1, wherein
    the first semiconductor layer has an impurity concentration of no less than 4E14 $cm^{-3}$ and no more than 7E16 $cm^{-3}$, and
    the second semiconductor layer has an impurity concentration of no less than 3.2E14 $cm^{-3}$ and no more than 4.5E16 $cm^{-3}$.

3. The semiconductor device as set forth in claim 1, wherein
    a thickness of the second semiconductor layer is no less than 27.3% of a width of the trench and no more than 36.4% of the width of the trench.

4. The semiconductor device as set forth in claim 1, further comprising
    an oxide region provided in the second semiconductor layer in a region including the edge.

5. The semiconductor device as set forth in claim 4, wherein
    the second semiconductor layer includes:
    a low-concentration impurity region; and
    a high-concentration impurity region formed in a region closer to the trench than the low-concentration impurity region is, the high-concentration impurity region having a higher impurity concentration than the low-concentration impurity region.

6. The semiconductor device as set forth in claim 1, further comprising:
    a trench insulating film provided within the trench, the trench insulating film being in contact with the second semiconductor layer; and
    a trench electrode provided within the trench, the trench electrode being in contact with the trench insulating film.

7. The semiconductor device as set forth in claim 1, wherein the trench provided in the first semiconductor layer includes a side wall.

8. The semiconductor device as set forth in claim 1, wherein wells of a second conductivity type are provided on both sides of the trench and on the first semiconductor layer.

9. The semiconductor device as set forth in claim 1, wherein the second semiconductor layer is an epitaxial semiconductor layer.

10. The semiconductor device as set forth in claim 1, wherein the first semiconductor layer is an epitaxial semiconductor layer.

11. A semiconductor device comprising:
- a semiconductor substrate containing impurities of a first conductivity type;
- a first semiconductor layer on a front surface of the semiconductor substrate, the first semiconductor layer containing impurities of a first conductivity type at a lower concentration than the impurities of the semiconductor substrate;
- a trench provided in the first semiconductor layer on a front surface side thereof; and
- a second semiconductor layer provided on an inner side wall and an inner base wall of the trench, the second semiconductor layer containing impurities of the first conductivity type at a lower concentration than the first semiconductor layer, wherein an area of the semiconductor device occupied by the semiconductor substrate from a schematic top view is divided between an active portion and a surrounding portion;

the surrounding portion surrounds the active portion from the schematic top view;

the surrounding portion does not include any trenches;

the surrounding portion includes a LOCOS region such that the active portion and the LOCOS region do not overlap; and the second semiconductor layer extends to outer edges of the semiconductor substrate from the schematic top view.

* * * * *